United States Patent [19]

Luke et al.

[11] Patent Number: 4,887,313
[45] Date of Patent: Dec. 12, 1989

[54] METHOD AND APPARATUS FOR MAKING PHASE STABLE MICROWAVE MEASUREMENTS

[75] Inventors: Charles M. Luke, Cumming; John B. Wilson, Lawrenceville, both of Ga.

[73] Assignee: Scientific Atlanta, Inc., Atlanta, Ga.

[21] Appl. No.: 7,406

[22] Filed: Jan. 27, 1987

[51] Int. Cl.[4] .............................................. H04B 9/00
[52] U.S. Cl. .................................... 455/612; 455/606; 455/617
[58] Field of Search ............... 455/606, 607, 617, 618, 455/619, 67, 600, 608, 615, 610, 612; 324/83 R, 84

[56] References Cited

U.S. PATENT DOCUMENTS

| | | | |
|---|---|---|---|
| 3,704,449 | 11/1972 | Hutchins | 340/198 |
| 3,879,733 | 4/1975 | Hansen et al. | 343/100 |
| 4,091,327 | 5/1975 | Larsen et al. | 324/95 |
| 4,118,668 | 10/1978 | Strayer, Jr. | 325/67 |
| 4,371,838 | 2/1983 | Grisom | 324/244 |
| 4,394,831 | 7/1983 | Egli et al. | 89/41 |
| 4,532,518 | 7/1985 | Gaglione et al. | 343/372 |
| 4,560,270 | 12/1985 | Wiklund et al. | 455/617 |

OTHER PUBLICATIONS

"Cable Instalation and Field Testing for a Fiber Optic Exploratory Trial", International Conference on Communication, IEEE, Jun. 4–7, 1978, pp. 14-3-1-14-3-6, Board et al.

"Use of Fiber Optic Frequency and Phase Determining Elements in Radar", Conference Proceedings of the 33rd Annual Symposium on Frequency Control, Atlantic City, NJ Arnold M. Levine.

Primary Examiner—Robert L. Griffin
Assistant Examiner—Leslie Van Beek
Attorney, Agent, or Firm—Kilpatrick & Cody

[57] ABSTRACT

Method and apparatus for making phase stable measurements of charateristics of microwave antennas and other devices utilizing an optical transmission path as a phase stable reference in order to identify phase errors along a radio frequency transmission path induced by flexing of a radio frequency transmitting cable as the antenna probe or antenna under test is moved in the course of testing. Similar apparatus and techniques are described for use with a harmonic mixer to gather receiver data which is free of phase errors caused by movement of the antenna.

9 Claims, 2 Drawing Sheets

METHOD AND APPARATUS FOR MAKING PHASE STABLE MICROWAVE MEASUREMENTS

BACKGROUND OF THE INVENTION

This invention relates to methods and apparatus for measuring the characteristics of microwave antennas.

It is frequently desirable to measure and compare the characteristics of a microwave antenna positioned in different physical positions. This has traditionally been done under "far-field" conditions where the distance between the test antenna or probe and the antenna under test is many times the diameter of the antenna under test. "Near-field" testing presents advantages, however, including the ability to perform such testing indoors in a small space.

Near-field testing requires determination of phase response, and measurement of phase response is also potentially desirable in other testing situations such as transmission of a microwave local oscillator signal to a harmonic mixer, which is sometimes done in far-field testing. In measuring the phase response of an antenna at different aspect angles or in performing near-field scanning of an antenna aperture, the antenna or an antenna probe must be moved mechanically. Such movement causes the cables to the antenna or probe to be flexed, thereby causing a change or error in the phase measurement because the path length through the cable is changed. This difference in length causes an error in phase measurements and makes it desirable to provide a phase stable reference or phase stable transmission path that is not affected by movement of the antenna or antenna probe.

In many far-field antenna ranges, the antenna cannot easily be located near the microwave receiver. Consequently, at high frequencies, it is advantageous to position a harmonic mixer at the output of the antenna in order to minimize radio frequency losses. In situations where the antenna moves, flexing occurs in the coaxial cable which transmits the local oscillator signal from the receiver to the harmonic mixer, thereby introducing phase instabilities and variations.

SUMMARY OF THE INVENTION

The present invention provides a phase stable reference by converting the test signal to intensity or amplitude modulation at an optical carrier frequency and transmitting the signal through a fiber optic cable to provide a reference signal to the moving platform on which the antenna or antenna probe is mounted. Provision of such a signal provides a phase stable reference which can be compared to the microwave signal to permit differences in phase due to cable flexing to be removed from measured data.

Alternatively, in remote local oscillator applications a fiber optics link is utilized to transmit intermediate frequency and local oscillator signals so that phase changes or discontinuities are not introduced by cable flexing.

By use of the present invention for transmission of local oscillator and intermediate frequency signals to and from a remote harmonic mixer located near the output of an antenna, the fiber optics link provides low losses in addition to improvement of phase stability. Such loss reduction permits location of the receiver at much greater distances from the antenna than is possible when coaxial cables are used for transmission of such signals. Such a fiber optics link is compatible with numerous existing antenna test systems. Additionally, the present invention may result in a local oscillator signal containing lower phase noise at the harmonic mixer because fiber optic transmission are immune to electromagnetic pulse (EMP) and radio frequency interference (RFI). The present invention may also protect the microwave receiver from lightning damage in view of the frequent lightning strikes on antenna towers.

Accordingly, it is an object of the present invention to provide a method of identifying and correcting for phase errors introduced by cable flexing during movement of a microwave antenna or antenna test probe during test and measuring procedures.

It is a further object of the present invention to provide a method and apparatus for transmitting a receiver local oscillator signal to a remote harmonic mixer while avoiding the phase errors frequently introduced by cable flexing in such configurations.

Other objects and advantages of the present invention will become apparent to those skilled in the art by reference to the following description, the associated drawing and the claims.

DETAILED DESCRIPTION OF THE DRAWINGS

Figure 1:
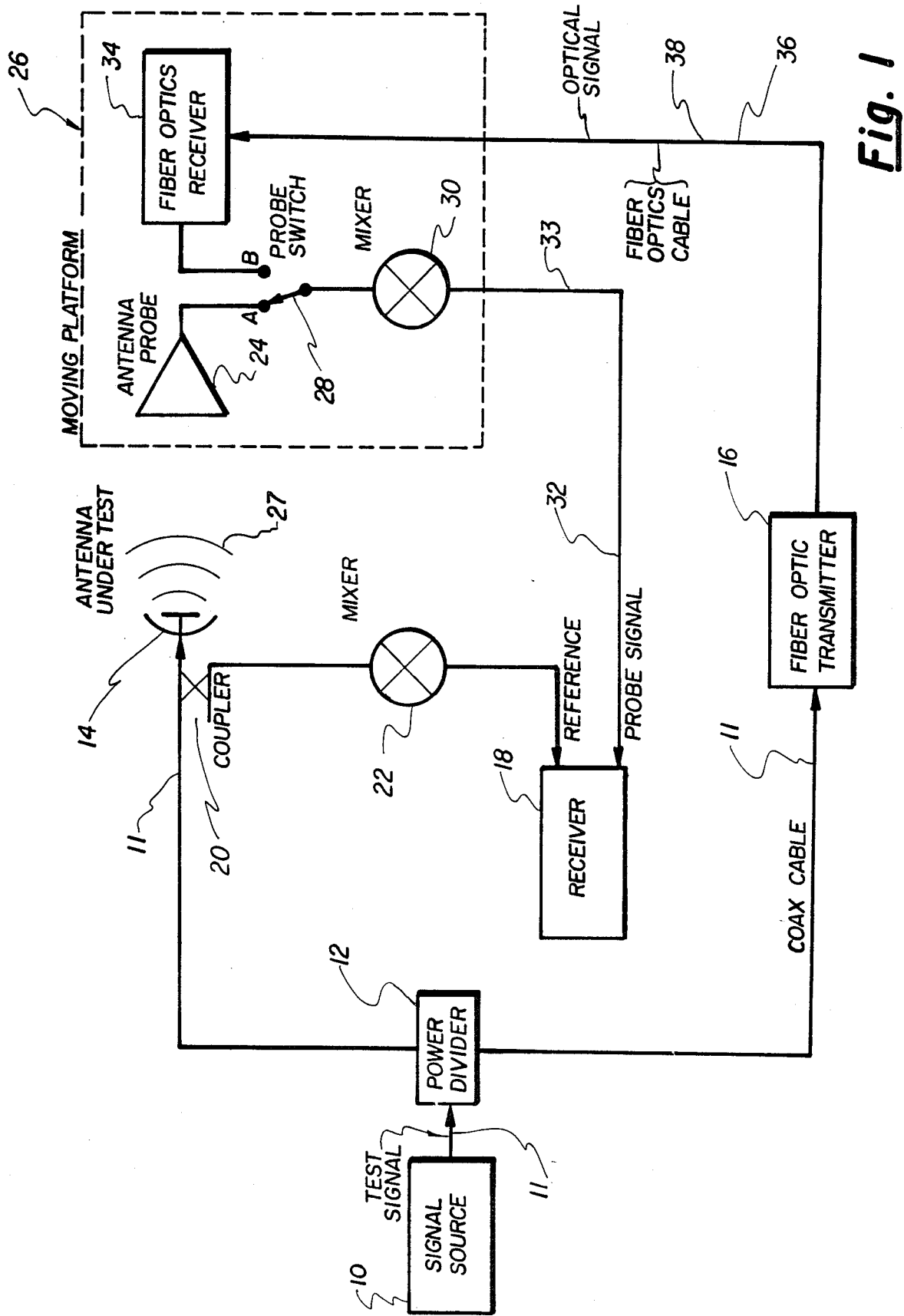
FIG. 1 is a schematic diagram of apparatus for practicing antenna measurements in accordance with the present invention by fiber optics transmission of a reference signal.

Referring to FIG. 1, a signal source 10 supplies a test signal 11 through a power divider 12 to the antenna under test 14 and fiber optic transmitter 16. The test signal 11 is also supplied to receiver 18 by means of coupler 20 through mixer 22. Antenna probe 24 mounted on moving platform 26 receives microwave signal 27 from antenna 14 and, when probe switch 28 is in position "A" connecting probe mixer 30 to antenna probe 24, signal 27 received by antenna probe 24 is transmitted through probe mixer 30 and cable 32 as probe cable signal 33 to receiver 18. At receiver 18 comparisons between the test signal 11 received from coupler 20 and the transmitted microwave signal 27 received by antenna probe 24 may be made to produce desired test data, including phase information.

Phase errors may be introduced in the signal 33 delivered to receiver 18 by cable 32 because of flexing of cable 32 as moving platform 26 is changed in position.

Determination of the amount of such phase error may be made by changing probe switch 28 to position "B," which connects mixer 30 to fiber optic receiver 34. Fiber optic receiver 34 receives signals transmitted along fiber optic cable 36 from fiber optic transmitter 16 which, as indicated above, transmits optical signal 38 converted from test signal 11 originating from signal source 10. Fiber optic transmitter 16 transmits the signal from signal source 10 as intensity modulation at an optical carrier frequency which is much higher than the microwave frequencies under test. This amplitude modulation envelope is not affected by phase change in the carrier. Consequently, any phase difference between the test signal 11 received from coupler 20 and the probe cable signal 33 received along cable 32 with probe switch 28 in position "B" is attributable to cable 32 flexing or other sources other than the characteristics of the signal received by antenna probe 34. The phase difference thus can be subtracted out of phase measurements made when probe switch 28 is in position "A."

As will be readily appreciated by one skilled in the art, the same principles may be applied if it is desired that the antenna under test 14 be mounted on moving platform 26 while antenna probe 24 is held stationary simply by exchanging antenna 14 for antenna probe 34 in the components illustrated in FIG. 1.

Signal source 10 may be a Scientific Atlanta Series 2150B Microwave Signal Source available form Scientific Atlanta, Inc. 3845 Pleasantdale Road, Atlanta, Ga. 30340. Receiver 18 may be a Scientific Atlanta Series 1780 Programmable Microwave Receiver. The present invention is also usable in association with the Scientific Atlanta 2022A Automatic Antenna Analyzer System or the earlier Series 2080 Antenna Analyzer also produced by Scientific Atlanta.

The present invention may be practiced using, as a fiber optics transmitter 16 and fiber optics cable 36, an Ortel TSL 4000 laser transmitter available from Ortel Corporation, 2015 West Chestnut Street, Alhambra, Calif. 91803. Fiber optics receiver 34 may be an Ortel PDO25-PM receiver available from the same source. Coupler 20 may be a Scientific Atlanta 4623-8 directional coupler, and mixer 22 may be a Scientific Atlanta 14-5 harmonic mixer.

Figure 2:
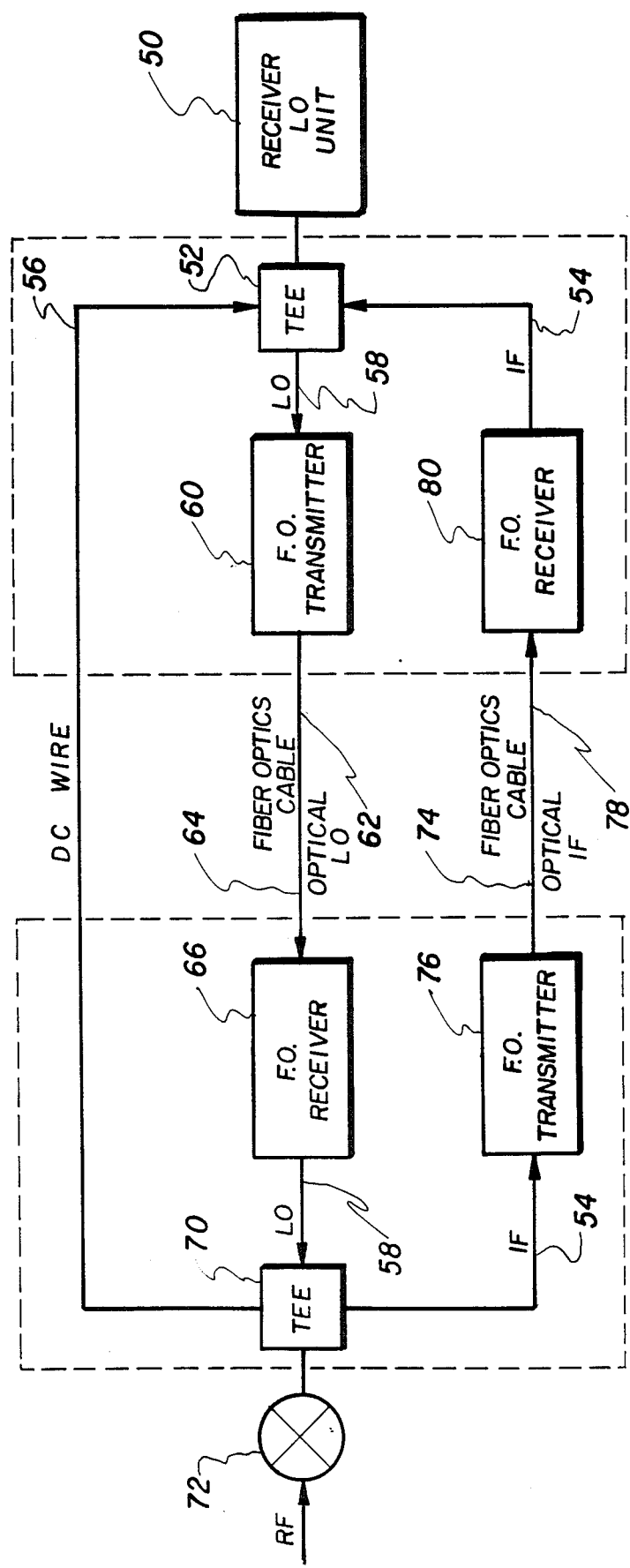
FIG. 2 is a schematic diagram of an alternative embodiment of the present invention showing apparatus for fiber optics transmission of a signals utilized in a remote local oscillator configuration.

FIG. 2 is a schematic diagram of a second embodiment of the present invention in which fiber optics transmission paths are utilized for local oscillator and intermediate frequency signals. The microwave receiver local oscillator 50 generates a microwave signal which is swept over a specified band and is transmitted to a frequency selective "TEE" or splitter 52, which separates the local oscillator signal from the received intermediate frequency signal 54 and a direct current mixer current 56. The local oscillator signal 58 is supplied to a local oscillator fiber optics transmitter 60 which converts the radio frequency (local oscillator) signal 58 into an optical (local oscillator) signal 62 by electro-optic or direct modulation of a laser diode (not shown). The optical signal 62 is transmitted over a fiber optics cable 64 to local oscillator fiber optics receiver 66. Because it is desirable for the local oscillator 58/62 signal to maintain optimum phase noise performance, pin photodiodes or a GaAs field effect transistor should be used as the detector in fiber optics receiver 66. Fiber optics receiver 66 includes an optical detector (not shown) and amplification stages, and receiver 66 converts the optical signal 62 back to radio frequency form as local oscillator signal 58. Signal 58 is applied to another frequency selective "TEE" 70, which multiplexes the signals transmitted to and received from the harmonic mixer 72.

Those signals include the direct current mixer current 56 which is transmitted from the remote "TEE" 70 to the receiver "TEE" 52 on a conventional conductor. The third signal handled by remote "TEE" 70 is intermediate frequency signal 54 which is transmitted from the remote location to the receiver location by converting it from a radio frequency signal 54 to a fiber optics signal 74 in intermediate frequency fiber optics transmitter 76. Intermediate frequency fiber optics transmitter 76 feeds fiber optics cable 78, along which fiber optics intermediate frequency signal 74 is transmitted for receipt by intermediate frequency fiber optics receiver 80. Receiver 80 converts optical signal 74 back into radio frequency signal 54, which is supplied to TEE 52, as noted above.

Each of fiber optics transmitters 60 and 76 may be an Ortel TLW-3005 wideband laser transmitter. Fiber optics receivers 66 and 80 may be Ortel RLW-1005 PIN photodiode receivers, and fiber optics cables 64 and 78 may be Pirelli G50S, available from Pirelli Cable Corporation, Cable Systems Division, 800 Rahway Avenue, Union, N.J. 07083. Each of "TEE" 52 and "TEE" 70 may be Scientific Atlanta part no. 31436. Receiver local oscillator unit 50 may be the local oscillator portion of the Scientific Atlanta series 1780 programmable microwave receiver or any other suitable receiver, as will be readily recognized by one skilled in the art.

The preceding description and drawings of the present invention are provided for purposes of explanation and illustration. It will be apparent to those skilled in the relevant art that modifications and changes may be made to the invention as described without departing from its scope and spirit.

We claim:

1. Apparatus for making phase stable microwave measurements comprising:
   a. a signal source coupled to a transmitting antenna and a fiber optics transmitter;
   b. a receiving antenna, a fiber optics receiver, and a means for selectively coupling either the fiber optics receiver or the receiving antenna to one end of a radio frequency transmitting cable, all mounted on a moveable platform;
   c. a means for transmitting an optical signal between the fiber optics transmitter and the fiber optics receiver; and
   d. a receiver for making signal comparisons coupled to the signal source and the other end of the radio frequency transmitting cable.

2. Apparatus for making phase stable microwave measurements in accordance with claim 1 wherein said optical transmission means is a fiber optics cable.

3. A method for correcting phase errors in microwave measurements comprising the steps of:
   a. transmitting a source signal to each of a transmitting antenna and a receiver for making signal comparisons;
   b. receiving the signal from the transmitting antenna with a receiving antenna mounted on a moveable platform and transmitting the received signal through a radio frequency transmitting cable to the receiver;
   c. comparing the two signals received by the receiver;
   d. converting the source signal to an optical signal and transmitting it to a means for receiving an optical signal mounted on the moveable platform;
   e. converting the optical signal received on the moving platform to a radio frequency signal and transmitting it to the receiver over the radio frequency transmitting cable;
   f. comparing the second set of signals received by the receiver;
   g. comparing the phase difference between the first pair of signals to the phase difference between the second pair of signals; and
   h. compensating in the measurements for the phase error determined as a result of the comparison made in the preceding step.

4. Apparatus for making phase stable microwave measurements comprising:
   a. a radio frequency source coupled to a harmonic mixer;
   b. a microwave receiver for generating a radio frequency local oscillator signal and receiving a radio frequency intermediate frequency signal;
   c. a fiber optics transmitter for converting the radio frequency local oscillator signal into an optical local oscillator signal and transmitting the optical local oscillator signal;
   d. a fiber optics receiver for receiving the optical local oscillator signal, converting it back into radio frequency form and supplying it to the harmonic mixer;
   e. a means for transmission of an optical signal between the fiber optics transmitter and fiber optics receiver; and
   f. a means for transmitting the intermediate frequency signal output by the harmonic mixer to the microwave receiver.

5. Apparatus for making phase stable microwave measurements in accordance with claim 4, wherein the means for transmitting the intermediate frequency signal comprises a second fiber optics transmitter for converting the radio frequency intermediate frequency signal into an optical intermediate frequency signal and transmitting the optical intermediate frequency signal, a second fiber optics receiver for receiving the optical intermediate frequency signal and converting it back into radio frequency form and a second means for transmission of an optical signal for transmission of the optical intermediate frequency signal between the second fiber optics transmitter and the second fiber optics receiver.

6. Apparatus for making phase stable microwave measurements in accordance with claim 5, wherein said each of said optical transmission means is a fiber optics cable.

7. Apparatus for transmitting a local oscillator signal generated by a receiver local oscillator and an intermediate frequency signal between the local oscillator of the receiver and a remote harmonic mixer comprising:
   a. a local oscillator fiber optics transmitter for receiving a radio frequency local oscillator signal from the local oscillator and converting it into an optical local oscillator signal;
   b. a fiber optics cable for transmitting the optical local oscillator signal from the local oscillator fiber optics transmitter;
   c. a local oscillator fiber optics receiver for receiving the optical local local oscillator signal from the local oscillator fiber optics cable and converting it back into a radio frequency signal and supplying it to the harmonic mixer;
   d. an intermediate frequency fiber optics transmitter for receiving a radio frequency intermediate frequency signal from the harmonic mixer and converting it into an optical intermediate frequency signal;
   e. an intermediate frequency fiber optics cable for transmitting the intermediate frequency optical signal from the intermediate frequency fiber optics transmitter; and
   f. an intermediate frequency fiber optics receiver for receiving the intermediate frequency fiber optical signal from the intermediate frequency fiber optics cable and converting it back into radio frequency from and supplying it to the receiver.

8. A method for receiving a microwave signal on a movable microwave antenna located at a position remote from a receiver while avoiding phase errors as a result of moving the antenna comprising the steps of:
   a. receiving the microwave signal on the microwave antenna;
   b. generating a local oscillator signal at the receiver and converting it into an optical signal;
   c. transmitting the local oscillator optical signal to a means for receiving the signal located adjacent to the antenna;
   d. converting the received local oscillator signal back into a radio frequency signal and harmonically mixing it with the received microwave signal to generate an intermediate frequency radio frequency signal;
   e. converting the intermediate frequency signal into an optical signal and transmitting it to a second means for receiving an optical signal mounted adjacent to the receiver; and
   f. converting the intermediate frequency optical signal back into a radio frequency signal and supplying it to the receiver.

9. A method of transmitting a local oscillator signal to and receiving an intermediate frequency signal from a remote location comprising the steps of:
   a. converting the local oscillator signal into an optical signal;
   b. transmitting the local oscillator optical signal to a means for receiving the signal located in the remote location;
   c. converting the received optical local oscillator signal into a radio frequency signal and harmonically mixing it with a second signal to generate an intermediate frequency radio frequency signal;
   d. converting the intermediate frequency signal into an optical signal and transmitting it to a second means for receiving an optical signal; and
   e. converting the intermediate frequency optical signal into a radio frequency signal and receiving that signal.

* * * * *